(12) United States Patent
Yuan et al.

(10) Patent No.: US 12,022,713 B2
(45) Date of Patent: Jun. 25, 2024

(54) ARRAY SUBSTRATE HAVING DETECTION LINE STRUCTURES BETWEEN ROWS OF SUB-PIXELS AND DETECTION METHOD THEREOF, AND DISPLAY PANEL HAVING THE SAME

(71) Applicants: Hefei Xinsheng Optoelectronics Technology Co., Ltd., Anhui (CN); BOE Technology Group Co., Ltd., Beijing (CN)

(72) Inventors: Can Yuan, Beijing (CN); Yongqian Li, Beijing (CN); Zhidong Yuan, Beijing (CN); Meng Li, Beijing (CN)

(73) Assignees: Hefei Xinsheng Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 82 days.

(21) Appl. No.: 17/731,874

(22) Filed: Apr. 28, 2022

(65) Prior Publication Data

US 2022/0320195 A1  Oct. 6, 2022

Related U.S. Application Data

(63) Continuation of application No. 16/645,088, filed as application No. PCT/CN2019/105510 on Sep. 12, 2019, now Pat. No. 11,322,550.

(30) Foreign Application Priority Data

Sep. 27, 2018  (CN) .......................... 201811134277.8

(51) Int. Cl.
*H01L 29/08* (2006.01)
*G09G 3/00* (2006.01)
(Continued)

(52) U.S. Cl.
CPC ............. *H10K 59/353* (2023.02); *G09G 3/00* (2013.01); *G09G 3/006* (2013.01);
(Continued)

(58) Field of Classification Search
CPC ............... H10K 59/353; H10K 59/131; H10K 59/1213; H10K 59/1216; G09G 3/006
(Continued)

(56) References Cited

U.S. PATENT DOCUMENTS 10,600,347 B2    3/2020  Hong
2016/0131954 A1*  5/2016  Li ........................... G09G 3/36
                                                                349/33
(Continued)

FOREIGN PATENT DOCUMENTS

CN      204481026 U  *  7/2015  ............. H01L 23/50
CN      107610640 A  *  1/2018  ............... G09G 3/32
(Continued)

OTHER PUBLICATIONS

Dec. 27, 2021—U.S. Notice of Allowance U.S. Appl. No. 16/645,088.
(Continued)

*Primary Examiner* — Phuc T Dang
(74) *Attorney, Agent, or Firm* — Banner & Witcoff, Ltd.

(57) ABSTRACT

An array substrate and a detection method thereof, and a display panel are disclosed. The array substrate includes a plurality of subpixels and a plurality of signal line structures. The plurality of subpixels are arranged in an array of a plurality of rows and a plurality of columns along a first direction and a second direction. Each signal line structure of the plurality of signal line structures includes at least one first detection line extending along the first direction; adjacent (n)th row and (n+1)th row of subpixels in the array form a subpixel row group, and the signal line structure is configured to be connected to the (n)th row and (n+1)th row
(Continued)

of subpixels and detect electrical characteristics of first transistors or light-emitting elements in the subpixels.

12 Claims, 9 Drawing Sheets

(51) Int. Cl.
  *H10K 59/121* (2023.01)
  *H10K 59/131* (2023.01)
  *H10K 59/35* (2023.01)

(52) U.S. Cl.
  CPC ..... *H10K 59/1213* (2023.02); *H10K 59/1216* (2023.02); *H10K 59/131* (2023.02)

(58) Field of Classification Search
  USPC ......................................................... 257/40
  See application file for complete search history.

(56) References Cited

U.S. PATENT DOCUMENTS

| | | | |
|---|---|---|---|
| 2017/0154579 A1 | 6/2017 | Choi et al. | |
| 2017/0162119 A1* | 6/2017 | Kim | G09G 3/3258 |
| 2017/0213065 A1 | 7/2017 | Kurasawa et al. | |
| 2017/0243539 A1 | 8/2017 | Li et al. | |
| 2018/0108843 A1* | 4/2018 | Koo | H10K 59/123 |
| 2018/0190192 A1 | 7/2018 | Kwon et al. | |
| 2018/0246596 A1 | 8/2018 | Takada et al. | |
| 2018/0315384 A1* | 11/2018 | Ikeda | G09G 3/007 |
| 2018/0342205 A1 | 11/2018 | Wang et al. | |
| 2020/0082756 A1 | 3/2020 | Lin et al. | |

FOREIGN PATENT DOCUMENTS

| | | |
|---|---|---|
| CN | 107799558 A | 3/2018 |
| CN | 108133947 A | 6/2018 |
| CN | 108257561 A | 7/2018 |
| CN | 108269537 A | 7/2018 |
| KR | 20170070439 A | 6/2017 |
| KR | 20180024314 A | 3/2018 |

OTHER PUBLICATIONS

May 18, 2022—(EP) Extended European Search Report Appn 19858706.5.

* cited by examiner

ARRAY SUBSTRATE HAVING DETECTION LINE STRUCTURES BETWEEN ROWS OF SUB-PIXELS AND DETECTION METHOD THEREOF, AND DISPLAY PANEL HAVING THE SAME

This application is a continuation of U.S. patent application Ser. No. 16/645,088 filed on Mar. 6, 2020 and issued on May 3, 2022 as U.S. Pat. No. 11,322,550, which is a national stage application of international application PCT/CN2019/105510, filed Sep. 12, 2019, which claims priority to China Patent Application No. 201811134277.8, filed on Sep. 27, 2018. The disclosures of the above-identified applications are hereby incorporated herein by reference in their entirety.

TECHNICAL FIELD

Embodiments of the present disclosure relate to an array substrate and a detection method thereof, and a display panel.

BACKGROUND

In the display field, organic light-emitting diode (OLED) display panels have the characteristics of self-luminous, high contrast, low power consumption, wide viewing angle, fast response speed, being suitable for flexible panels, wide temperature application range, simple manufacturing, etc., and have a broad development prospect. External compensation circuits are widely used in OLED display panels, so the display panel has a uniform display effect.

SUMMARY

At least one embodiment of the present disclosure provides an array substrate comprising a plurality of subpixels and a plurality of detection line structures, the plurality of subpixels are arranged in an array of a plurality of rows and a plurality of columns along a first direction and a second direction, and the first direction intersects the second direction; each of the plurality of detection line structures includes at least one first detection line extending along the first direction; at least one subpixel in each row of subpixels includes a light-emitting element and a first transistor that drives the light-emitting element to emit light; adjacent (n)th row and (n+1)th row of subpixels in the array form a subpixel row group, one detection line structure is provided between the (n)th row and (n+1)th row of subpixels in each subpixel row group, and the detection line structure is configured to be connected to the (n)th row and (n+1)th row of subpixels and detect electrical characteristics of first transistors or light-emitting elements in the (n)th row and (n+1)th row of subpixels; and n is an odd number or an even number greater than zero.

In some embodiments, any one of the plurality of detection line structures is not located between two adjacent subpixel row groups.

In some embodiments, the array substrate further comprises a plurality of first power supply lines extending in the first direction, each of the plurality of first power supply lines is provided between two adjacent subpixel row groups, and each of the plurality of first power supply lines is configured to be connected to two rows of subpixels adjacent to the each of the plurality of first power supply lines and provide a first power supply signal.

In some embodiments, the plurality of first power supply lines and the plurality of detection line structures are alternately arranged along the second direction.

In some embodiments, the two adjacent subpixel row groups are symmetrical with respect to a first power supply line located between the two adjacent subpixel row groups.

In some embodiments, the array substrate further comprises a plurality of second power supply lines, the plurality of second power supply lines extend along the second direction, and the plurality of second power supply lines respectively cross the plurality of first power supply lines and are electrically connected to the plurality of first power supply lines, respectively.

In some embodiments, each of the plurality of detection line structures includes a plurality of first detection lines, the plurality of first detection lines are sequentially arranged along the first direction and are insulated from each other, and first detection lines of the plurality of detection line structures form a detection line array that is arranged in a plurality of rows and a plurality of columns along the first direction and the second direction; and each of the plurality of first detection lines is correspondingly connected to at least two of the subpixels located in a same row.

In some embodiments, the array substrate further comprises a plurality of second detection lines, the plurality of second detection lines extend along the second direction and respectively correspond to the plurality of columns of first detection lines in the detection line array, the plurality of second detection lines respectively cross the plurality of columns of first detection lines in the detection line array and are electrically connected to the plurality of columns of first detection lines in the detection line array respectively, and a plurality of first detection lines located in a same column are electrically connected to each other through a second detection line corresponding to the plurality of first detection lines located in the same column.

In some embodiments, every m subpixels located in a same row form a pixel unit, each of the plurality of first detection lines is correspondingly connected to one or two of the pixel units in the same row, and m=2, 3, or 4.

In some embodiments, each of the plurality of the first detection lines is correspondingly connected to two of the pixel units, and a second detection line connected to the each of the plurality of the first detection lines is provided between two pixel units correspondingly connected to a same first detection line.

In some embodiments, the subpixel further comprises a second transistor, a third transistor, and a first capacitor, a gate electrode of the second transistor and a first electrode of the second transistor are configured to receive a first scanning signal and a data signal, respectively, and a second electrode of the second transistor is connected to a gate electrode of the first transistor; a first electrode of the first transistor is configured to receive a first power signal, and a second electrode of the first transistor is connected to a first electrode of the third transistor and a first electrode of the light-emitting element, respectively; a gate electrode of the third transistor is configured to receive a second scanning signal, and a second electrode of the third transistor is electrically connected to a detection line structure connected to the subpixel; a second electrode of the light-emitting element is configured to receive a second power signal; and one terminal of the first capacitor is connected to the gate electrode of the first transistor, and the other terminal of the first capacitor is connected to the second electrode of the first transistor.

In some embodiments, the array substrate further comprises a plurality of first scanning lines extending along the first direction, the plurality of first scanning lines are respectively connected to the plurality of rows of subpixels in a one-to-one correspondence, and are respectively connected to gate electrodes of second transistors in the plurality of rows of subpixels correspondingly connected thereto to provide the first scanning signal.

In some embodiments, in each subpixel row group, two first scanning lines respectively connected to the (n)th row and (n+1)th row of subpixels are provided between the (n)th row and (n+1)th row of subpixels.

In some embodiments, in each subpixel row group, the detection line structure connected to the (n)th row and (n+1)th row of subpixels is provided between the two first scanning lines respectively connected to the (n)th row and (n+1)th row of subpixels.

In some embodiments, in each subpixel row group, the two first scanning lines respectively connected to the (n)th row and (n+1)th row of subpixels are symmetrical with respect to the detection line structure located between the (n)th row and (n+1)th row of sub pixels.

In some embodiments, each of the plurality of the first scanning lines is further connected to gate electrodes of third transistors in subpixels correspondingly connected to the each of the plurality of first scanning lines to provide the second scanning signal.

In some embodiments, the array substrate further comprises a plurality of second scanning lines extending along the first direction, the plurality of second scanning lines are respectively connected to the plurality of rows of subpixels in a one-to-one correspondence, and are respectively connected to gate electrodes of third transistors in correspondingly connected subpixels to provide the second scanning signal.

In some embodiments, the second transistor and the third transistor are arranged side by side along the first direction, and a channel length direction of the second transistor and a channel length direction of the third transistor are both parallel to the second direction.

In some embodiments, in each subpixel row group, the (n)th row and (n+1)th row of subpixels are symmetrical with respect to the detection line structure connected to the (n)th row and (n+1)th row of subpixels.

In some embodiments, the light-emitting element is a top emission organic light emitting diode.

At least one embodiment of the present disclosure further provides a display panel comprising the above array substrate.

At least one embodiment of the present disclosure further provides a detection method for the above array substrate, the detection method comprises: selecting a target subpixel among the plurality of subpixels; applying a detection signal to the target subpixel in the array; and obtaining electrical characteristics of a first transistor or a light-emitting element in the target subpixel through a detection line structure connected to the target subpixel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Figure 1A:
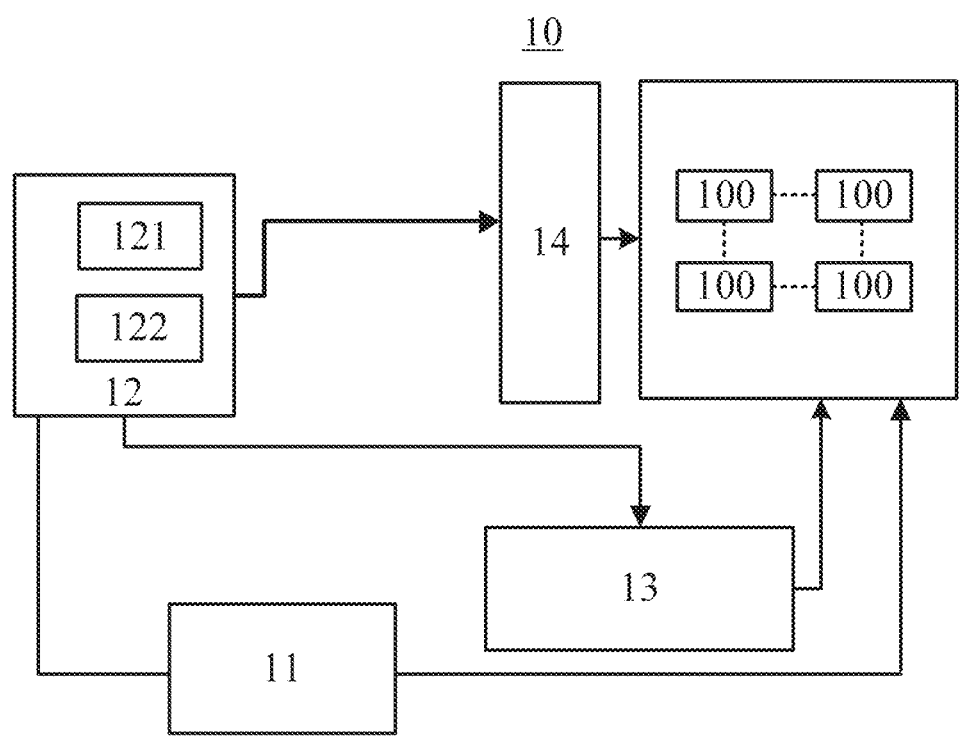
FIG. 1A is a block diagram of an array substrate.
Figure 1B:
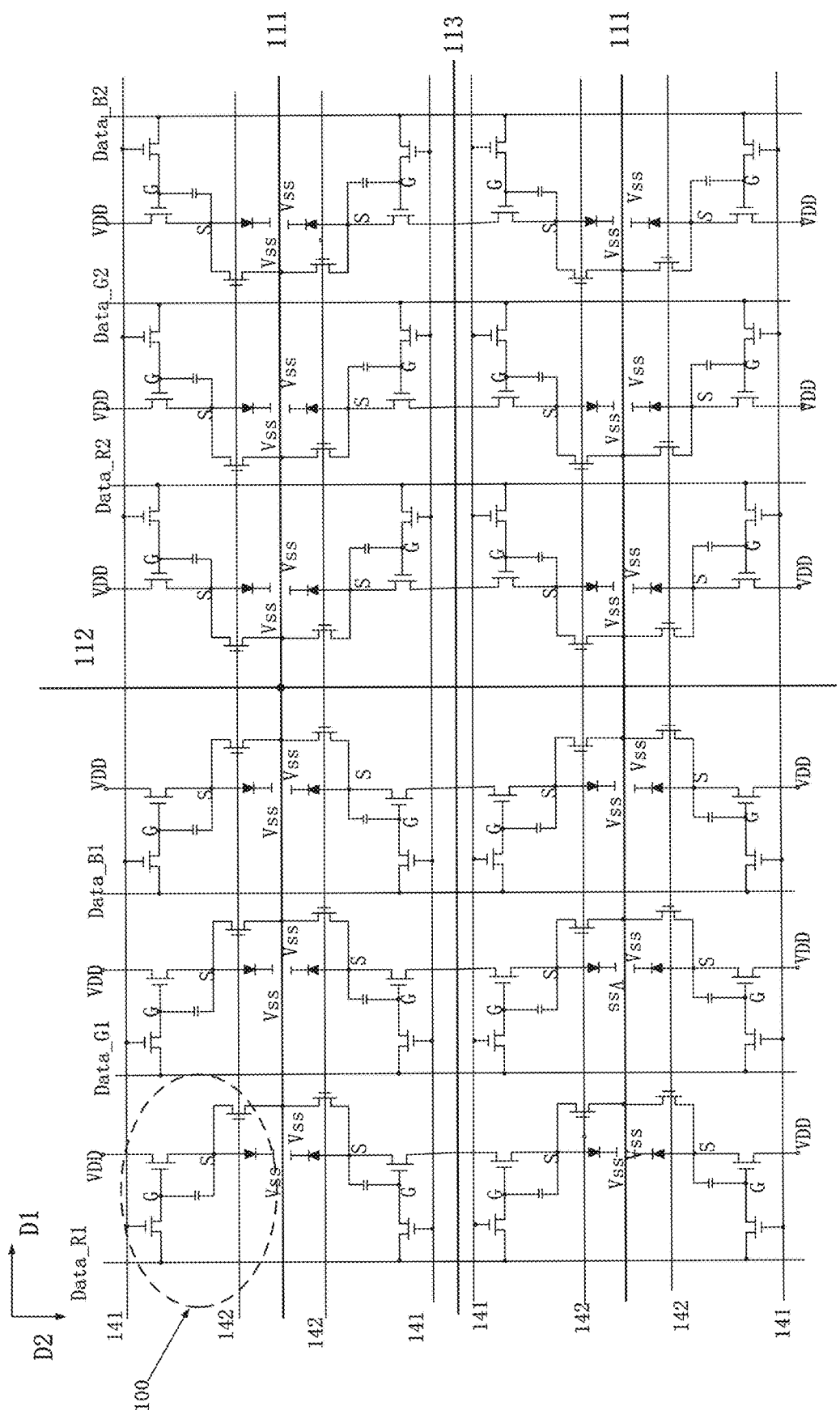
FIG. 1B is a schematic circuit diagram of an array substrate.

FIG. 1A is a block diagram of an array substrate 10, and FIG. 1B is a schematic circuit diagram of an array substrate. As illustrated in FIG. 1A and FIG. 1B, the array substrate 10 includes a plurality of subpixels 100 arranged in an array structure of a plurality of rows and a plurality of columns along a first direction D1 and a second direction D2, and each subpixel 100 includes a light-emitting element and a pixel circuit that drives the light-emitting element to emit light. For example, the array substrate is an organic light emitting diode (OLED) array substrate, and the light-emitting element is an OLED. A display panel including the array substrate further includes a plurality of scanning lines and a plurality of data lines for providing scanning signals and data signals to the plurality of subpixels, thereby driving the plurality of subpixels. As required, the display panel may further include a power supply line, a sensing line, and the like. The power supply line is also called the power line.

For example, every m subpixels 100 form one pixel unit, and the m subpixels include, for example, OLEDs emitting light of different colors (basic colors), respectively, thereby implementing color display. For example, m=2, 3, or 4. For example, one pixel unit includes three subpixels 100, and the three subpixels emit a red light (R), a green light (G), and a blue light (B), respectively. For another example, one pixel unit includes four subpixels 100 of RGBW, and the four subpixels emit a red light (R), a green light (G), a blue light (B), and a white light (W), respectively. In order to make the pixel unit emit a color light, there may be multiple implementations, including but not limited to, using OLEDs that emit three primary colors, or using an OLED that emits a white light with a color filter, or using an OLED that emits a blue light with a light conversion material (for example, a fluorescent layer or a quantum dot layer), etc.

Figure 1C:
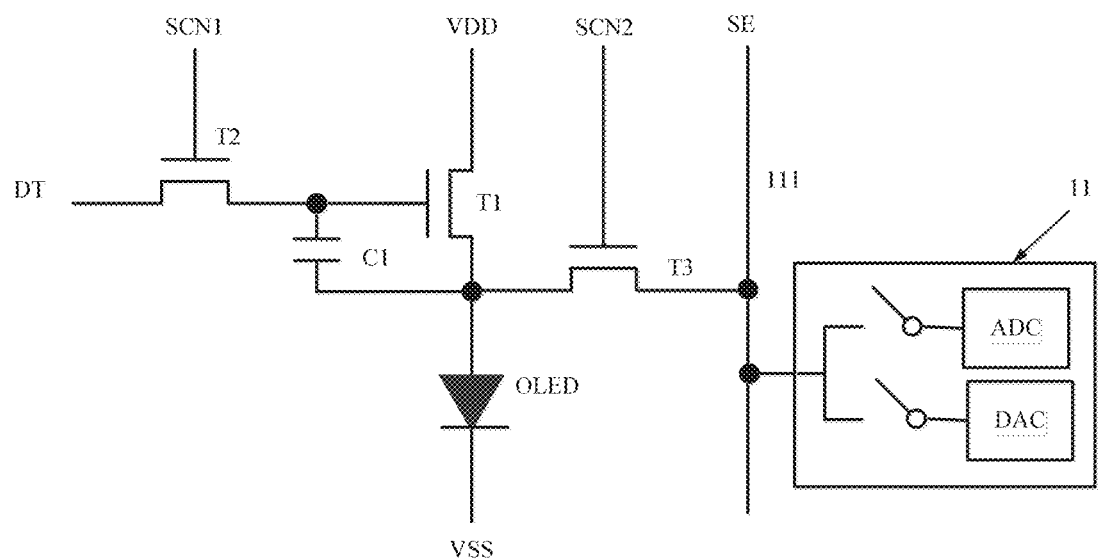
FIG. 1C is a schematic diagram of a 3T1C pixel circuit.

FIG. 1C is a schematic diagram illustrating a 3T1C pixel circuit for an OLED array substrate (display panel). As needed, the pixel circuit may further include a compensation circuit, a reset circuit, and the like. Referring to FIG. 1B together with FIG. 1C, the pixel circuit includes a first transistor T1, a second transistor T2, a third transistor T3, a first capacitor C1, and a first detection line 111. The first detection line can also be called the first signal portion. A first electrode of the first transistor T1 is connected to a first power supply line 113, a second electrode of the first transistor T1 is connected to an anode of the OLED and a first electrode of the third transistor T3, and a gate electrode of the first transistor T1 is connected to a second electrode of the second transistor T2. The first power supply line can also be called the first power line. A distance between the first signal portion and the first capacitor is larger than a distance between the first power line and the first capacitor. The first transistor T1 is a driving transistor that drives the OLED to emit light. A gate electrode of the second transistor T2 is connected to a first scanning line 141 to receive a first scanning signal SCN1, and a first electrode of the second transistor T2 is connected to a data line to receive a data signal DT. The first capacitor C1 is connected between the gate electrode of the first transistor T1 and the second electrode of the first transistor T1. A cathode of the OLED is connected to a second power supply voltage VSS, for example, connected to ground. A gate electrode of the third transistor T3 is connected to a second scanning line 142 to receive a second scanning signal SCN2, and a second electrode of the third transistor T3 is connected to a detection circuit 11 through the first detection line 111 to receive a detection signal SE. The first detection line 111 is configured to detect an electrical characteristic of the first transistor T1, and the electrical characteristic includes, for example, a threshold voltage and/or a carrier mobility of the first transistor T1. The first detection line 111 may also be configured to detect an electrical characteristic of the OLED, and the electrical characteristic includes a threshold voltage of the OLED, a driving current of the OLED, or the like. For example, the first detection line 111 is connected to the detection circuit 11 to output an electrical signal of the pixel circuit to the detection circuit 11 for analysis and detection. The detection circuit is, for example, a conventional circuit including a digital-to-analog converter (DAC), an analog-to-digital converter (ADC), and the like, which are not described in detail in the embodiments of the present disclosure.

For example, the first scanning line 141 and the second scanning line 142 may be different scanning lines, that is, the first scanning signal SCN1 and the second scanning signal SCN2 may be signals provided by different scanning lines. The first scanning signal SCN1 and the second scanning signal SCN2 may also be the same signal provided by the same scanning line, that is, the first scanning line 141 and the second scanning line 142 may be the same scanning line. The first scanning signal SCN1 and the second scanning signal SCN2 may be the same or different as required.

For example, a detection process of the 3T1C pixel circuit includes applying a detection control signal to itself, and then obtaining the electrical characteristics of the driving transistor through a detection line connected thereto, as described below. During a writing stage, the first scanning signal SCN1 and the second scanning signal SCN2 are both on signals, the second transistor T2 and the third transistor T3 are both turned on, the data signal DT is transmitted to the gate electrode of the first transistor T1 and a first electrode of the first capacitor C1 through the second transistor T2, the detection signal SE is transmitted to the second electrode of the first transistor T1 and a second electrode of the first capacitor C1 through the third transistor T3, and the voltage of the detection signal SE does not reach the lighting voltage of the OLED, so the OLED does not emit light. After that, the first detection line 111 is floated, and the second transistor T2 and the third transistor T3 are both turned on. Under action of the first power supply voltage VDD, the first transistor T1 generates a driving current and charges the second electrode of the first capacitor to a voltage Vdata-Vth, Vdata is a voltage of the data signal DT, and Vth is a threshold voltage of the first transistor T1. At this time, the first transistor T1 changes from an on state to an off state. During a detecting stage, the first scanning signal SCN1 and the second scanning signal SCN2 are both on signals, and the second transistor T2 and the third transistor T3 are both turned on. The saturation voltage Vdata-Vth on the second electrode of the first transistor T1 (that is, the second electrode of the first capacitor C1) is sampled by using the detection circuit 11 through the first detection line 111, so as to obtain the electrical characteristic of the threshold voltage of the first transistor T1. In this detection process, the detection control signal includes a scanning signal, a data signal, a detection signal, and the like applied to the second transistor T2 and the third transistor T3.

For example, another detection process of the 3T1C pixel circuit includes applying a detection control signal to itself, and then obtaining the electrical characteristics of the light-emitting element through the detection line connected thereto, as described below. During a first stage, the first scanning signal SCN1 is an off signal, the second scanning signal SCN2 is an on signal, the second transistor T2 is turned off, the third transistor T3 is turned on, and the first detection line 111 writes a reset signal to the anode of the OLED through the third transistor T3. During a second stage, the first scanning signal SCN1 is an on signal, the second scanning signal SCN2 is an off signal, the second transistor T2 is turned on, the third transistor T3 is turned off, the data signal DT is transmitted to the gate electrode of the first transistor T1 through the second transistor T2, and the first transistor T1 is turned on and generates the driving current to charge the anode of the OLED to a working voltage. During a third stage, the first scanning signal SCN1 is an off signal, the second scanning signal SCN2 is an on signal, the second transistor T2 is turned off, the third transistor T3 is turned on, the first detection line 111 writes the reset signal to the anode of the OLED through the third transistor T3 again. At this time, due to a bootstrap effect of the first capacitor C1, the voltage across the first capacitor C1 remains unchanged, the first detection line 111 is floated, and the first transistor T1 charges the first detection line 111 until it is saturated, and then the saturation voltage on the first detection line 111 is sampled by using the detection circuit 11 to obtain the electrical characteristics of the OLED. In this example, the first scanning line and the second scanning line may be separately provided to provide the first scanning signal SCN1 and the second scanning signal SCN2, respectively. In addition, in this detection process, the detection control signal includes a scanning signal, a data signal, a detection signal, and the like applied to the second transistor T2 and the third transistor T3.

For example, as illustrated in FIG. 1A, the array substrate 10 may further include a data driving circuit 13 and a scan driving circuit 14. The data driving circuit 13 is configured to output a data signal, for example the data signal DT described above, as needed (for example, an image signal input to a display device). The pixel circuit of each subpixel is further configured to receive the data signal and apply the data signal to the gate electrode of the first transistor. The scan driving circuit 14 is configured to output various scanning signals, for example, the scanning signals include the first scanning signal SCN1 and the second scanning signal SCN2 described above, and the scan driving circuit 14 may be, for example, an integrated circuit chip or a gate driving circuit (GOA) directly prepared on a display substrate.

For example, the array substrate 10 further includes a control circuit 12. For example, the control circuit 12 is configured to control the data driving circuit 13 to apply the data signal, and to control the gate driving circuit to apply the scanning signal. An example of the control circuit 12 is a timing control circuit (T-con). The control circuit 12 may be in various forms, for example, including a processor 121 and a memory 122. The memory 121 includes executable code, and the processor 121 runs the executable code to perform the foregoing detection method.

For example, the processor 121 may be a central processing unit (CPU) or other forms of processing devices having data processing capabilities and/or instruction execution capabilities, and may include, for example, a microprocessor, a programmable logic controller (PLC), and the like.

For example, the memory 122 may include one or more computer program products, which may include various forms of computer-readable storage media, for example volatile memory and/or non-volatile memory. The volatile memory may include, for example, a random access memory (RAM) and/or a cache memory (cache). The non-volatile memory may include, for example, a read-only memory (ROM), a hard disk, a flash memory, and the like. One or more computer program instructions may be stored in the computer-readable storage medium, and the processor 121 can execute functions desired by the program instructions. Various application programs and various data can further be stored in the computer-readable storage medium, for example the electrical characteristic parameters obtained in the detection method described above.

Figure 2:
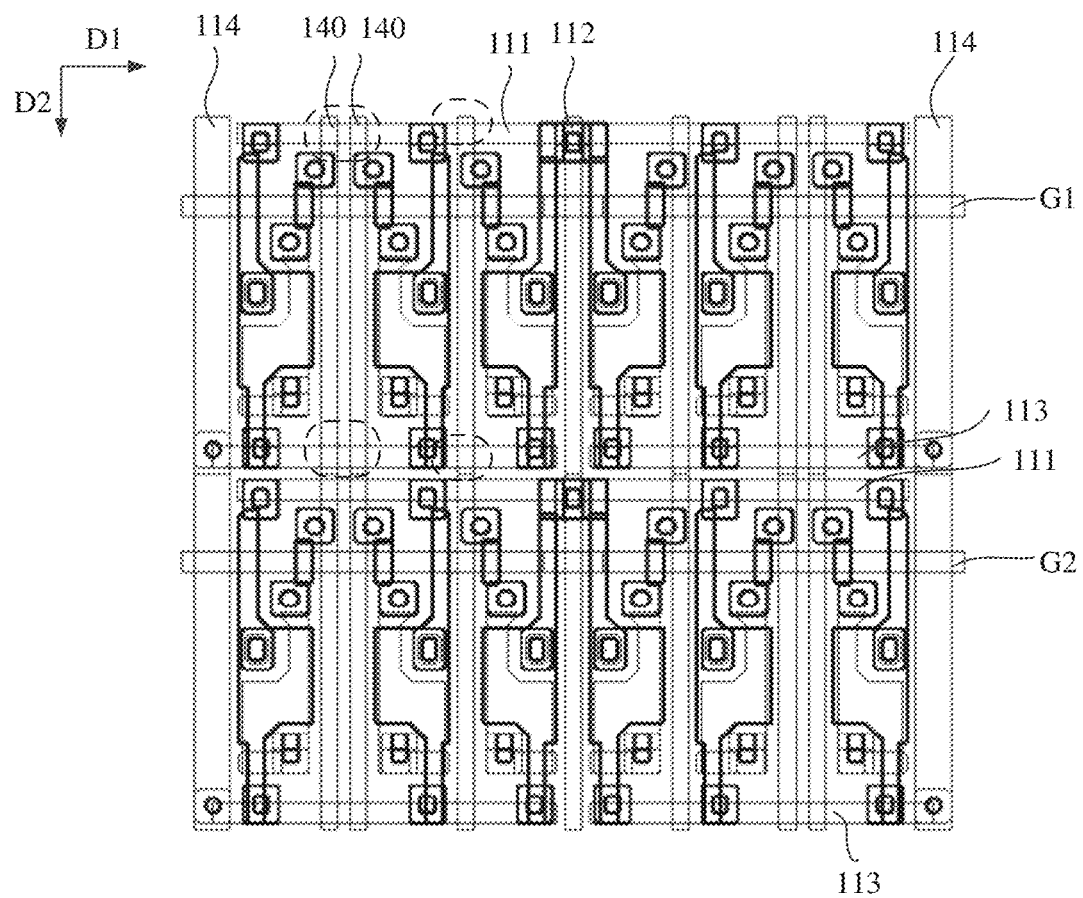
FIG. 2 is a schematic diagram of a layout structure of an array substrate.

FIG. 2 is a schematic diagram of a layout structure of an array substrate, and only a part of the pixel array in the array substrate is illustrated in FIG. 2. As illustrated in FIG. 2, a plurality of first detection lines 111 extend along a first direction (e.g., a row direction of the array) D1, and are connected to rows of subpixels, respectively. A plurality of first scanning lines G1 and G2 extend along the first direction D1, and are connected to the rows of subpixels, respectively. A plurality of first power supply lines 113 extend along the first direction D1, and are connected to the rows of subpixels. That is, each row of subpixels is provided with one first detection line, one first scanning line and one first power supply line. A plurality of data lines 140 extend along a second direction (e.g., a column direction of the array) D2, and are connected to columns of subpixels, respectively, for example a first column of red subpixel, a first column of green subpixel, a first column of blue subpixel, a second column of red subpixel, a second column of green subpixel, and a second column of blue subpixel. The array substrate further includes a second detection line 112 extending along the second direction D2 and a plurality of second power supply lines 114 along the second direction D2. The second detection line can also be called the second signal portion. The second power supply lines can also be called the second power lines. The second detection lines 112 cross the plurality of first detection lines 111 and are electrically connected to the plurality of first detection lines 111, respectively, thereby causing the plurality of first detection lines 111 in different rows to be electrically connected with each other, and the second power supply lines 114 cross the plurality of first power supply lines 113 and are electrically connected to the plurality of first power supply lines 113. The first direction D1 and the second direction D2 intersect, for example, orthogonal to each other.

The first power supply line 113 and the first detection line 111 overlap with the data line extending along the second direction D2 in a direction perpendicular to the array substrate to generate a parasitic capacitance, and the overlapped portion is, for example, illustrated by a dashed box in FIG. 2. The parasitic capacitance generated by the overlapped portion not only affects the signal transmission efficiency of the data line and the first detection line, but also easily causes yield problems such as short circuits due to static electricity and other factors.

An embodiment of the present disclosure provides an array substrate. In the subpixel array of the array substrate, adjacent (n)th row and (n+1)th row of subpixels form a subpixel row group, a detection line structure is provided between two rows of subpixels of each subpixel row group, and the detection line structure includes at least one first detection line, and is configured to be connected to the (n)th row and (n+1)th row of subpixels and to detect the electrical characteristics of the first transistor or the light-emitting element in the subpixels, where n is an odd number or an even number greater than zero. For example, n= 1, 3, 5 . . . , or n=2, 4, 6 . . . . The detection line structure can also be called the first signal line structure. The orthographic projection of the first signal portion is substantially surrounded by the orthographic projection of the second signal portion and the first power lines.

The array substrate reduces the number of detection line structures (first detection lines) by alternately sharing the detection line structure between adjacent rows of subpixels, thereby reducing the overlap of the first detection lines in the detection line structure and the data lines. This can not only improve product yield, but also reduce parasitic capacitance between lines. For example, the parasitic capacitance of the first detection line is reduced by about 20%, which provides technical support for high-frequency driving of a high-resolution (PPI) display panel.

Figure 3A:
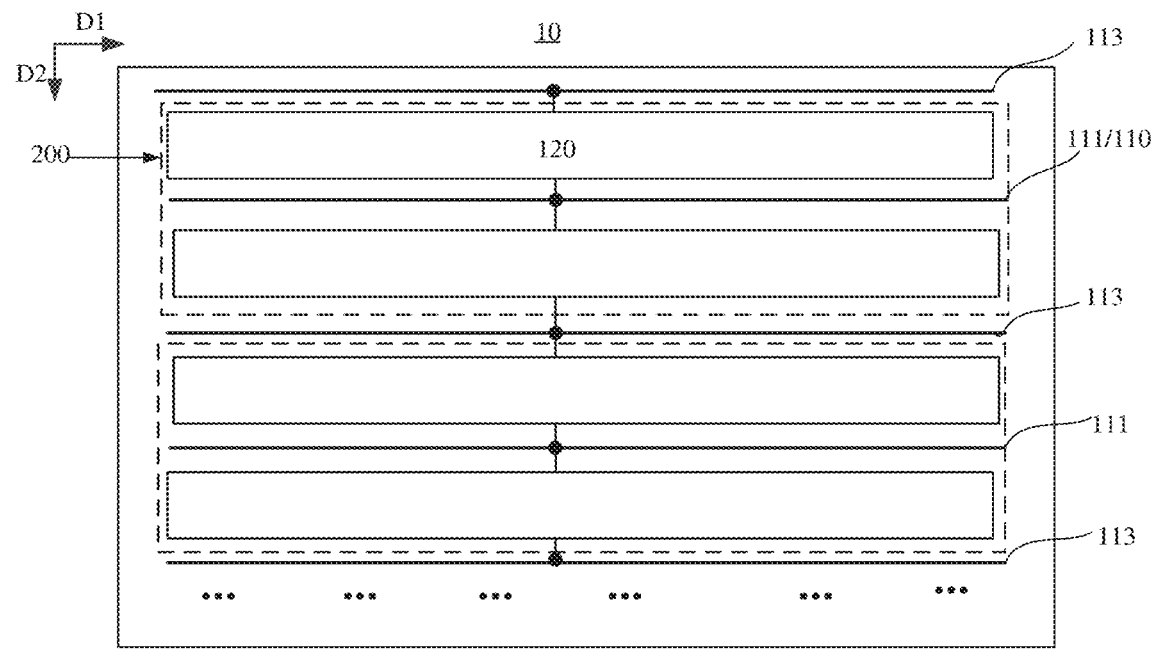
FIG. 3A is first schematic diagram of an array substrate provided by an embodiment of the present disclosure.
Figure 3B:
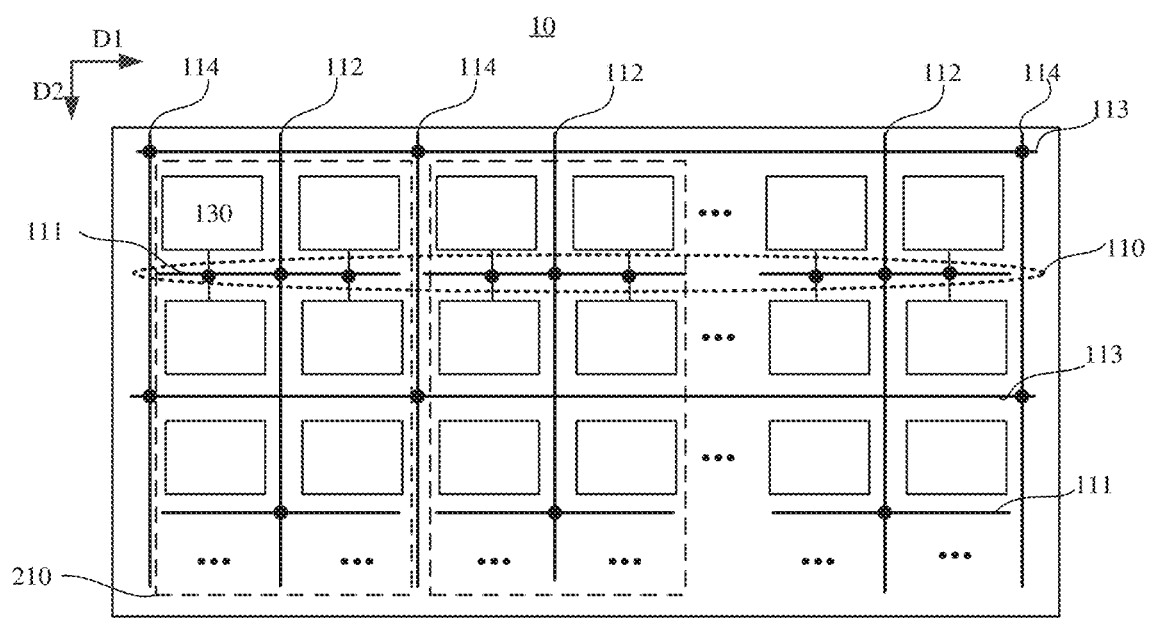
FIG. 3B is a second schematic diagram of an array substrate provided by an embodiment of the present disclosure.

It should be noted that the "detection line structure" in the embodiment of the present disclosure may include only one first detection line extending along the first direction, that is, a row of subpixels share the same first detection line (as illustrated in FIG. 3A). The detection line structure may also include a plurality of first detection lines (as illustrated in FIG. 3B) that are insulated from each other and are sequentially arranged along the first direction. In this case, a row of subpixels is divided into a plurality of regions which are connected to a plurality of first detection lines to receive detection signals, respectively. By providing the plurality of first detection lines in a row of subpixels to provide detection signals in different regions, the charging speed of each first detection line may be increased, thereby increasing the detection speed.

It should further be noted that "row" and "column" in this disclosure are not necessarily distributed in a straight line, and may be distributed in a curve, such as in a snake shape. Accordingly, the overall trend of the first detection line (or the detection line structure) extends along the first direction, and does not necessarily to extend in a straight line.

FIG. 3A is a first schematic diagram illustrating an array substrate provided by an embodiment of the present disclosure. The array substrate includes a plurality of subpixels, the plurality of subpixels are arranged in an array of a plurality of rows and a plurality of columns along the first direction D1 and the second direction D2, and at least one subpixel in each row of subpixels include a light-emitting element and a pixel circuit that drives the light-emitting element to emit light. For example, the array substrate is an array substrate of an organic light emitting diode (OLED) display panel, and the light-emitting element of the subpixel is an OLED. The pixel circuit is, for example, the 3T1C pixel circuit described above or other pixel circuits based on the 3T1C pixel circuit that have functions such as compensation and reset, which is not limited in the embodiments of the present disclosure. For example, the array substrate includes a display region and a peripheral region outside the display region, and the pixel array may be located only in the display region. In this case, each subpixel in the pixel array includes the light-emitting element and the pixel circuit; in other examples, the pixel array may further include a portion located in the peripheral region, for example, include dummy subpixels located in the peripheral region, and the dummy subpixel does not emit light, for example, does not include a light-emitting element or a pixel circuit.

An example in which each detection line structure 110 includes one first detection line 111 is illustrated in FIG. 3A. In order to clearly illustrate the characteristics of the first detection line 111 shared by the subpixels in the embodiment of the present disclosure, one row of subpixels 120 is briefly illustrated in FIG. 3A, only the first detection line 111 and the first power supply line 113 are illustrated in FIG. 3A, and signal lines such as the second detection line, the second power supply line, and the data line are omitted for clarity. The connection relationship of connecting with the row of subpixels 120 in FIG. 3A represents that connecting with each subpixel 100 in the row of subpixels 120.

As illustrated in FIG. 3A, the adjacent (n)th row and (n+1)th row of subpixels 120 form a subpixel row group 200 (as illustrated by a dashed box in FIG. 3A), and n is an odd number or an even number greater than zero. One first detection line 111 is provided between two rows of subpixels 100 of each subpixel row group 200, and the first detection line is configured to be connected to two rows ((n)th row and (n+1)th row) of subpixels of the subpixel row group 200, and to detect the electrical characteristics of first transistors or light-emitting elements in the two rows of subpixels. For example, any one of the plurality of detection line structures is not located between two adjacent subpixel row groups 200, that is, in the embodiment illustrated in FIG. 3A, there is no first detection line 111 between two adjacent subpixel row groups 200.

For example, every m subpixels 100 form a pixel unit, and the m subpixels include, for example, light-emitting elements emitting different colors of light, respectively, thereby achieving color display. For example, m=2, 3, or 4. For example, m subpixels in a pixel unit are arranged in one row or two rows. For example, in the case where m subpixels in a pixel unit are arranged in two rows, the first detection line 111 is provided between two rows of subpixels in the same pixel unit, so the subpixels in the same pixel unit share the same first detection line 111.

Compared with the technical solution in which each row of subpixels is configured with one first detection line, in the array substrate provided by the embodiment of the present disclosure, every two rows of subpixels share one first detection line, the number of first detection lines is reduced by half, thereby reducing the overlap of the first detection lines and the data lines, which can not only improve product yield, but also reduce parasitic capacitance between lines.

For example, one first power line 113 is provided on two opposite sides of the first signal portion. For example, one first power supply line 113 is provided between two adjacent subpixel row groups 200, and each first power supply line 113 is configured to be connected to two rows of subpixels adjacent to each first power supply line 113 and provide a first power supply signal, such as the first power supply voltage VDD. For example, in the subpixel array, the plurality of first power supply lines 113 and the plurality of first detection lines 111 are alternately distributed along the second direction D2.

In this way, the array substrate provided by the embodiment of the present disclosure further shares the first power supply line 113, the number of first detection lines is reduced, thereby reducing the overlap of the first detection lines and the data lines, which further improves the product yield and reduces the parasitic capacitance between the lines.

FIG. 3B is a second schematic diagram illustrating an array substrate provided by an embodiment of the present disclosure. For example, as illustrated in FIG. 3B, each detection line structure 110 may include a plurality of first detection lines 111 sequentially arranged along the first direction D1 and insulated from each other, and the plurality of first detection lines 111 in the plurality of detection line structures 110 form a detection line array arranged in a plurality of rows and a plurality of columns along the first direction D1 and the second direction D2. The detection line array is also called the signal portion array. Each first detection line 111 is correspondingly connected to at least two subpixels 100 located in the same row, that is, a row of subpixels is divided into a plurality of regions, which are connected to the plurality of first detection lines 111 in the detection line structure 110, respectively.

As illustrated in FIG. 3B, the array substrate 10 includes a plurality of pixel units 130 arranged in an array, and each pixel unit 130 includes m subpixels 100. For example, the m subpixels 100 are located in the same row, that is, each pixel unit 130 is distributed in the same row. For clarity, the positional relationship between the first detection line 111 and the pixel unit 130 is mainly illustrated in FIG. 3B, the connection relationship between the first detection line 111 and the subpixels in the pixel unit 130 is not illustrated in FIG. 3B, and only the connection relationship between the first detection lines 111 in one detection line structure 110 and the pixel units 130 is schematically illustrated in FIG. 3B.

For example, the array substrate includes a plurality of second detection lines 112, each second detection line 112 extends along a second direction D2 and respectively correspond to the plurality of columns of first detection lines 111 in the detection line array, and the plurality of second detection lines respectively cross the plurality of columns of first detection lines in the detection line array and are electrically connected to the plurality of columns of first detection lines 111 in the detection line array, respectively. A plurality of first detection lines 111 located in a same column of the detection line array are electrically connected to each other through a second detection line 112 corresponding to the plurality of first detection lines located in the same column. A plurality of first detection lines 111 located in the same detection line structure 110 (that is, located in the same row) are electrically connected to different second detection lines 112, respectively. It can be understood that each first detection line 111 is correspondingly connected to two adjacent rows of subpixels. Here, only the connection between one row of subpixels and the first detection line 111 is described, and the connection of another row of subpixels is similar to this and will not be described again. A row of subpixels is divided into a plurality of regions which are connected to a plurality of first detection lines to receive detection signals, respectively. By providing a plurality of first detection lines to provide detection signals in different regions, the charging speed of each first detection line may be increased, thereby increasing the detection speed.

For example, in the case where a plurality of subpixels in a pixel unit are distributed in the same row, each first detection line 111 is correspondingly connected to one pixel unit or two pixel units in the same row, thereby preventing each first detection line 111 from affecting its signal transmission rate due to being connected to too many subpixels, such as the charging rate of the first detection line.

For example, in the case of m=4, that is, one pixel unit includes four subpixels 100 (for example, four kinds of subpixels of RGBW), one first detection line 111 is correspondingly connected to four subpixels of one pixel unit in the same row. In this case, the second detection line correspondingly connected to the first detection line 111 is provided in the middle of the four subpixels. For example, the four subpixels are symmetrical with respect to the second detection line.

For example, in the case of m=3, that is, one pixel unit includes three subpixels 100 (for example, three kinds of subpixels of RGB), and one first detection line 111 is correspondingly connected to six subpixels of two pixel units in the same row. In this case, the second detection line corresponding connected to the first detection line 111 is provided in the middle of the six subpixels. For example, the six subpixels are symmetrical with respect to the second detection line.

With continued reference to FIG. 3B, the array substrate includes a plurality of subpixels arranged in an array structure of a plurality of rows and a plurality of columns along the first direction D1 and the second direction D2. At least one subpixel in each row of subpixels includes a light-emitting element and a pixel circuit that drives the light-emitting element to emit light. For example, the array substrate is an array substrate of an organic light emitting diode (OLED) display panel, and the light-emitting element of the subpixel is an OLED. The pixel circuit is, for example, the 3T1C pixel circuit described above or other pixel circuits based on the 3T1C pixel circuit described above that have functions such as compensation and reset.

As illustrated in FIG. 3B, each detection line structure 110 includes a plurality of first detection lines 111 that are sequentially arranged along the first direction D1 and are insulated from each other. Each first detection line 111 is correspondingly connected to two pixel units 130 in the same row, and different first detection lines 111 are connected to different second detection lines 112, respectively. For example, the second detection line 112 connected to the first detection line 111 is provided between two pixel units 130 correspondingly connected to the first detection line 111.

For example, the adjacent (x)th column and (x+1)th column of pixel units 130 form a pixel unit column group 210 (as illustrated by a vertical dashed box in FIG. 3B), and x is an odd number or an even number greater than zero. A second power supply line 114 is provided between the adjacent pixel unit column groups 210, the second power supply line 114 extends along the second direction D2, and the second power supply line 114 cross the first power supply line 113 and is connected to the first power supply line 113. For example, the plurality of second power supply lines 114 and the plurality of second detection lines 112 are alternately arranged in the first direction D1.

Figure 4A:
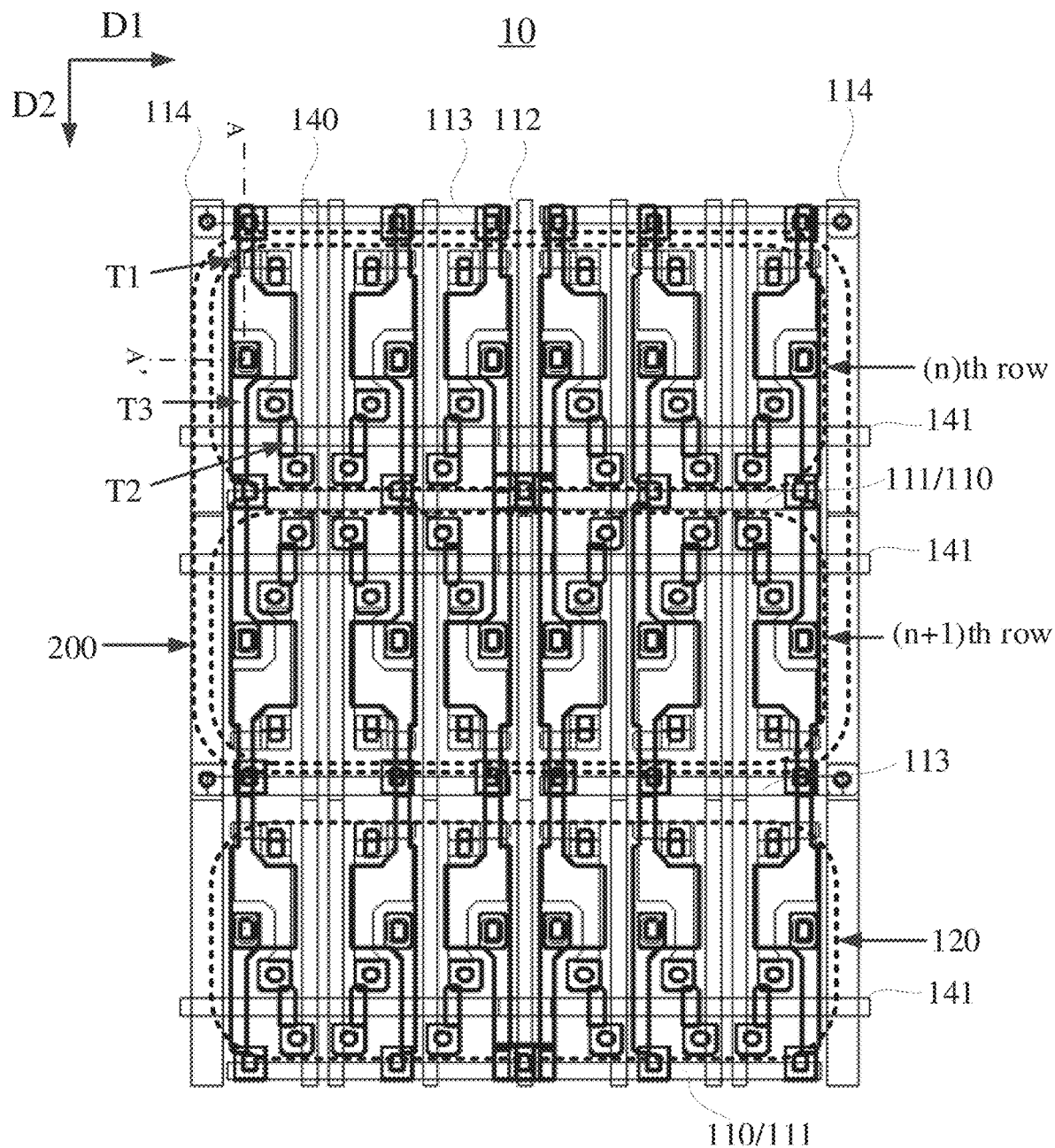
FIG. 4A is a third schematic diagram of an array substrate provided by an embodiment of the present disclosure.
Figure 4B:
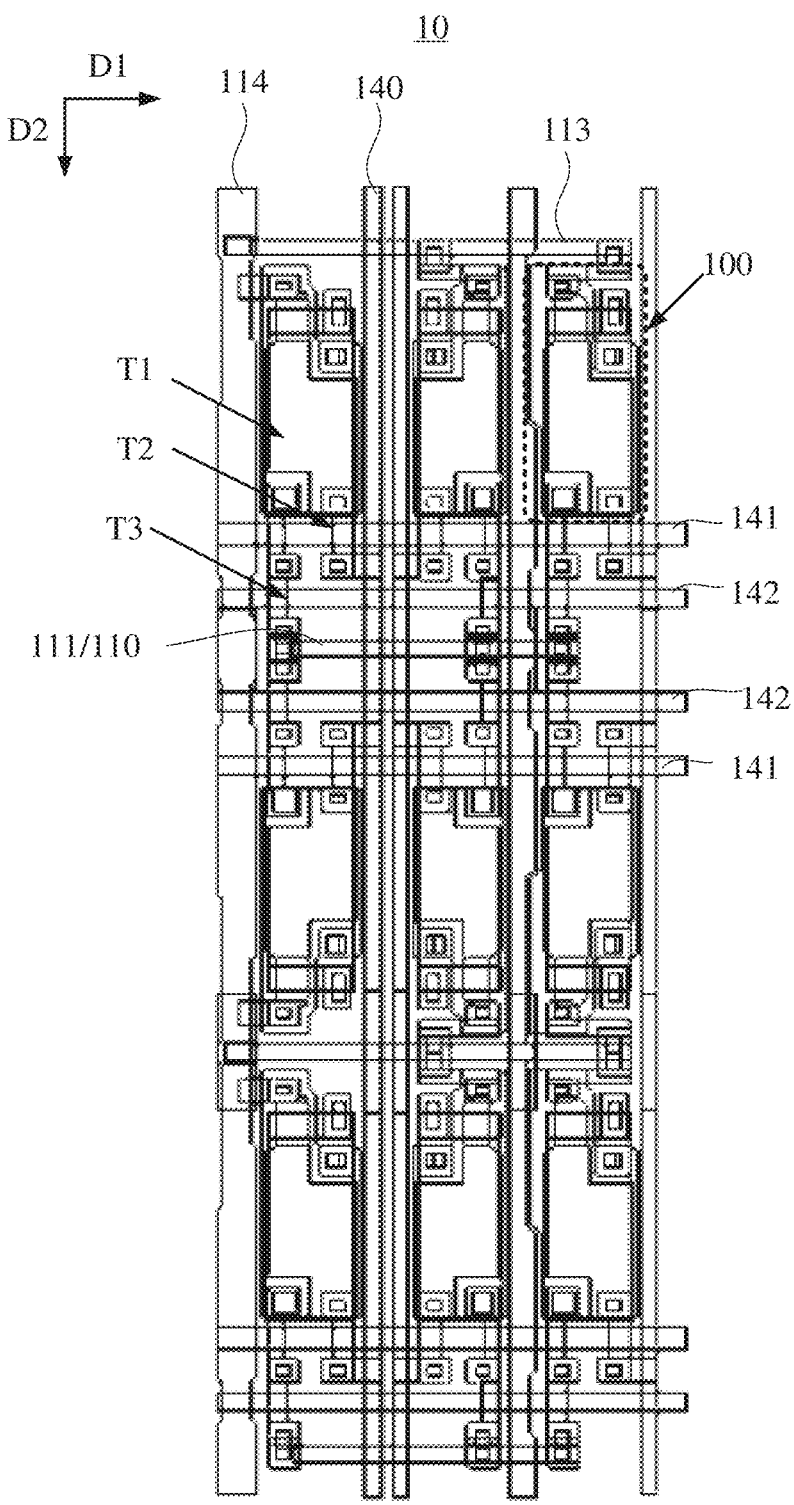
FIG. 4B is a fourth schematic diagram of an array substrate provided by an embodiment of the present disclosure.

The following still takes the 3T1C pixel circuit illustrated in FIG. 1B-FIG. 1C as an example and further describes the array substrate provided by the embodiment of the present disclosure with reference to FIG. 4A-FIG. 4B, but the specific structure of the pixel circuit is not limited by the embodiment of the present disclosure.

FIG. 4A is a schematic diagram illustrating an array substrate provided by an embodiment of the present disclosure. For clarity, only a part of the subpixel array (3 rows and 6 columns of subpixels 100) in the array substrate is illustrated in the FIG. 4. For each row of subpixels 100, only a part correspondingly connected to one first detection line 111 is illustrated. For example, the subpixel array includes a plurality of part of the subpixel array illustrated in FIG. 4A.

For example, the array substrate is an array substrate of an organic light emitting diode (OLED) display panel, and the light-emitting element of the subpixel is an OLED. For example, three adjacent subpixels 100 in each row of subpixels form one pixel unit 130, that is, two pixel units 130 are illustrated in each row of subpixels in FIG. 4A. For example, as illustrated in FIG. 4A, one first detection line 111 is correspondingly connected to six subpixels located in the same row. One first detection line 111 is correspondingly connected to two pixel units 130 located in the same row.

Please refer to FIG. 1C, FIG. 3A-FIG. 3B together with FIG. 4A, a plurality of first scanning lines 141 extend along the first direction D1, and are correspondingly connected to gate electrodes of second transistors T2 in the rows of subpixels, respectively, to provide the first scanning signal SCN1.

For example, the first scanning line 141 is further connected to gate electrodes of third transistors T3 in the correspondingly connected subpixels to provide a second scanning signal, that is, in the embodiment illustrated in FIG. 4A, both the first scanning signal SCN1 and the second scanning signal SCN2 are scanning signals provided by the first scanning lines 114.

For example, in one subpixel 100, the second transistor T2 and the third transistor T3 are arranged side by side along the first direction D1, and the channel length direction of the second transistor T2 and the channel length direction of the third transistor T3 are both along the second direction D2, that is, are both parallel to the second direction D2.

For example, in each subpixel row group 200 (as illustrated by a large dashed box in FIG. 4A), two first scanning lines 141 respectively connected to the (n)th row and (n+1)th row of subpixels are provided between the (n)th row and (n+1)th row of subpixels.

For example, in each subpixel row group 200, a first detection line 111 (the detection line structure 110) connected to the (n)th row and (n+1)th row of subpixels 120 (as illustrated by a small dashed box in FIG. 4A) is provided between two first scanning lines 141 to which the (n)th row and (n+1)th row of subpixels are respectively connected, and the two first scanning lines 111 are symmetrical with respect to the first detection line 111 (the detection line structure 110).

For example, in each subpixel row group 200, the (n)th row and (n+1)th row of subpixels are symmetrical with respect to the detection line structure 110 connected thereto. In each subpixel group 200, the (n)th row and (n+1)th row of subpixels, and the two first scanning lines 141 respectively connected to the (n)th row and (n+1)th row of subpixels are symmetrical with respect to the same detection line structure 110 (that is, the detection line structure 110 connected to the (n)th row and (n+1)th row of subpixels), respectively.

For example, in the case where each first detection line 111 is correspondingly connected to two pixel units 130 in the same row as illustrated in FIG. 4A, the second detection line 112 connected to the first detection line 111 is provided between two pixel units 130 to which the first detection line 111 is correspondingly connected, and the two pixel units 130 to which the first detection line 111 is correspondingly connected are symmetrical with respect to the second detection line 112.

For example, for each row of subpixels, the (y)th subpixel and (y+1)th subpixel 100 are symmetrical with respect to the second direction D2, and y is an odd number.

For example, two adjacent subpixel row groups 200 are symmetrical with respect to the first power supply line 113 located between the two adjacent subpixel row groups 200.

FIG. 4B is a schematic diagram illustrating an array substrate provided by another embodiment of the present disclosure. For example, the array substrate is an array substrate of an organic light emitting diode (OLED) display panel, and the light-emitting element of the subpixel is an OLED. Only a part of the subpixel array (3 rows and 3 columns of subpixels) in the array substrate is illustrated in FIG. 4B. For each row of subpixels 100, only a part corresponding connected to one first detection line 111 is illustrated in FIG. 4B. For example, the subpixel array includes a plurality of parts of the subpixel array illustrated in FIG. 4B. For example, three subpixels in each row emit a red light, a green light, and a blue light respectively to form a pixel unit. However, the embodiment of the present disclosure does not limit this.

As illustrated in FIG. 4B, the array substrate 10 further includes a plurality of second scanning lines 142 extending along the first direction D1, and the plurality of second scanning lines 142 are respectively connected to rows of subpixels in a one-to-one manner, and are respectively connected to the gate electrode of the third transistor T3 in the subpixel correspondingly connected thereto to provide the second scanning signal SCN2, that is, the gate electrode of the second transistor T2 and the gate electrode of the third transistor T3 are connected to the first scanning line 141 and the second scanning line 142, respectively, and the first scanning signal SCN1 and the second scanning signal SCN2 are provided by different signal lines, respectively.

For example, in each subpixel row group 200, the detection line structure 110 connected to the (n)th row and (n+1)th row of subpixels is provided between two first scanning lines 141 and two second scanning lines 142 respectively connected to the (n)th row and (n+1)th row of subpixels, and the two first scanning lines 141 and the two second scanning lines 142 are symmetrical with respect to the detection line structure 110, respectively.

Figure 5:
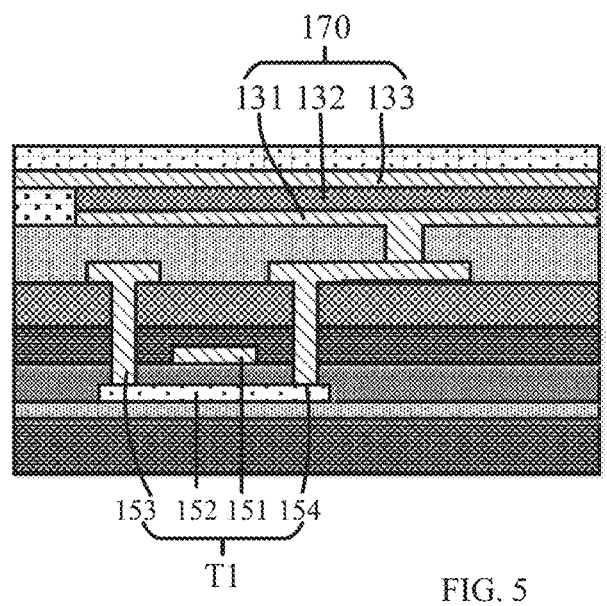
FIG. 5 is a cross-sectional view of an array substrate provided by an embodiment of the present disclosure.

FIG. 5 illustrates a cross-sectional view of the array substrate illustrated in FIG. 4A along a section line A-A'. For clarity, only the first transistor T1 and the light-emitting element 170 are illustrated in FIG. 5. For example, the array substrate is an array substrate of an organic light emitting diode (OLED) display panel, and the light-emitting element of the subpixel is an OLED. As illustrated in FIG. 5, the light-emitting element 170 includes a first electrode 131, a light emitting layer 132, and a second electrode 133, one of the first electrode 131 and the second electrode 133 is an anode, and the other is a cathode. For example, the light-emitting element 170 is an organic light emitting diode. For example, the light-emitting element may include a hole injection layer, a hole transmission layer, an electron injection layer, an electron transmission layer, and the like in addition to the light emitting layer 132.

The first transistor T1 includes a gate electrode 151, an active layer 152, a source electrode 153, and a drain electrode 154. The type, material, and structure of the first transistor T1 is not limited in the embodiment of the present disclosure, for example, the first transistor T1 may be a top-gate type, a bottom-gate type, and the like, the active layer of the first transistor T1 may be amorphous silicon, polysilicon (e.g., low-temperature polysilicon or high-temperature polysilicon), an oxide semiconductor (e.g., IGZO), or the like, and the first transistor T1 may be an N-type or a P-type.

For example, the light-emitting element 170 has a top emission structure, the first electrode 131 is reflective and the second electrode 133 is transmissive or semi-transmissive. For example, the first electrode 131 adopts a material with a high work function to serve as an anode, such as an ITO/Ag/ITO laminated structure. The second electrode 133 adopts a material with a low work function to serve as a cathode, such as a semi-transmissive metal or metal alloy material, such as an Ag/Mg alloy material.

In the array substrate provided by the embodiment of the present disclosure, for example, please refer to FIG. 4A and FIG. 4B, because light-transmitting regions (that is, regions outside transistors, blank regions in the figure) in the pixels are concentrated on both sides of the detection line structure 110, and the detection line structure 110 is not provided in a one-to-one correspondence with rows of subpixels, the light-emitting elements of the top emission structure can make the light-emitting elements evenly distributed and not limited to the light-transmitting regions in the pixels, which helps the display panel to achieve a uniform display effect.

Figure 6:
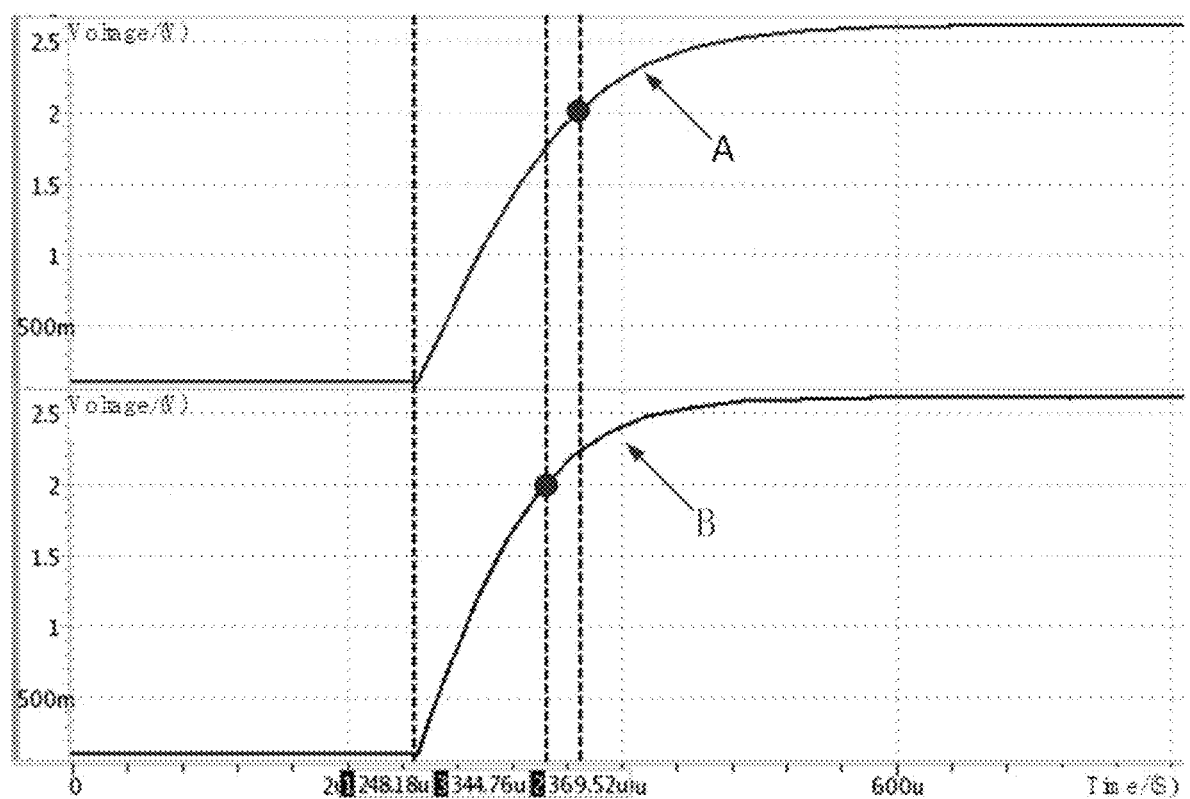
FIG. 6 is a simulation comparison diagram of the array substrate illustrated in FIG. 4A and the array substrate illustrated in FIG. 2.

FIG. 6 illustrates a simulation comparison diagram between the array substrate illustrated in FIG. 4A and the array substrate illustrated in FIG. 2. Curve A illustrates a charging process of the first detection line in the array substrate illustrated in FIG. 2, and curve B illustrates a charging process of the first detection line in the array substrate illustrated in FIG. 4A. The two array substrates for comparing have the same features (e.g., dimensions, materials, etc.) except for the differences in layout design illustrated. As illustrated in FIG. 6, in the array substrate illustrated in FIG. 2, the time required to charge the voltage of the first detection line from 0 to 2V is about 120 μs, while in the array substrate provided by the embodiment of the present disclosure illustrated in FIG. 4A, the time required to charge the voltage of the first detection line from 0 to 2V is about 96 μs. Compared with the array substrate illustrated in FIG. 2, the charging rate is increased by 25%.

Figure 7:
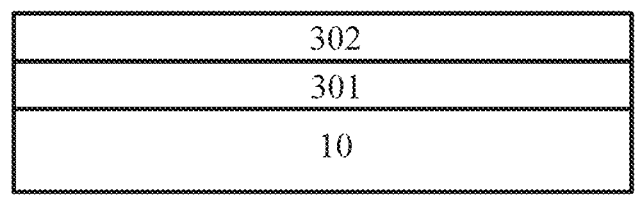
FIG. 7 is a schematic diagram of a display panel provided by an embodiment of the present disclosure.

As illustrated in FIG. 7, an embodiment of the present disclosure further provides a display panel 300 including the above-mentioned array substrate 10. For example, the display panel is an OLED display panel, and accordingly, the array substrate included therein is an OLED array substrate, and the light-emitting element of the subpixel is an OLED. For example, the display panel further includes an encapsulation layer 301 and a cover plate 302 provided on the array substrate 10, and the encapsulation layer 301 is configured to seal the light-emitting element 170 so as to prevent damage to the device due to infiltration of external moisture and oxygen into the light-emitting element and the pixel circuit. For example, the encapsulation layer 301 includes an organic thin film or a structure in which an organic thin film and an inorganic thin film are alternately stacked. For example, a water-absorbing layer (not illustrated) may be further provided between the encapsulation layer 301 and the array substrate 10, and configured to absorb moisture or sol remaining in the light-emitting element 170 during the previous manufacturing process. The cover plate 302 is, for example, a glass cover plate. For example, the cover plate 302 and the encapsulation layer 301 may adopt an integrated structure.

An embodiment of the present disclosure further provides a detection method for detecting the above-mentioned array substrate. The detection method includes: selecting a target subpixel among the plurality of subpixels, applying a detection signal to the target subpixel in the subpixel array, and obtaining the electrical characteristics of the first transistor or the light-emitting element in the target subpixel through a detection line structure (the first detection line) connected to the target subpixel.

For example, a target subpixel is selected by applying a corresponding gate signal to the subpixel. Taking the pixel circuit illustrated in FIG. 1C as an example, the third transistor T3 may be turned on by applying a gate signal to it, thereby allowing the detection circuit 11 to apply a detection signal to the first transistor T1 through the third transistor T3 to perform detection. For the specific process, please refer to the description of FIG. 1C above, which will not be repeated here.

In the embodiment of the present disclosure, because the adjacent (n)th row and (n+1)th row of subpixels 120 form the subpixel row group 200 (e.g., as illustrated by a large dashed box in FIG. 4A), one detection line structure 110 is provided between the two rows of subpixels 100 of each subpixel row group 200, and the detection line structure 110 is configured to be connected to the two rows (the (n)th row and (n+1)th row) of subpixels of the subpixel row group 200 and to detect the electrical characteristics of the first transistors or light-emitting elements in the two rows of subpixels. Therefore, a time-division multiplexing method is required for each subpixel row group 200, so the first detection line 110 in the shared detection line structure 110 can be time-divisionally connected to each subpixel in the subpixel row group 200, and each subpixel in the subpixel row group 200 can be detected. For example, for the 3T1C pixel circuit described above, whether to select a certain target subpixel may be determined by whether the third transistor T3 is turned on. For the 3T1C pixel circuit described above, in the case where the detection control signal is applied, the detection method refers to, for example, the foregoing description, and is not repeated here.

What are described above is related to the illustrative embodiments of the disclosure only and not limitative to the scope of the disclosure; the scopes of the disclosure are defined by the accompanying claims.

What is claimed is:

1. An array substrate, comprising a plurality of subpixels and a plurality of first signal line structures,
    wherein the plurality of subpixels are arranged in an array of a plurality of rows along a first direction and a plurality of columns along a second direction, and the first direction intersects the second direction;
    each first signal line structure of the plurality of first signal line structures includes at least one first signal portion extending along the first direction;
    at least one subpixel in each row of subpixels in the array includes a light-emitting element and a first transistor that drives the light-emitting element to emit light;
    adjacent (n)th row and (n+1)th row of subpixels in the array form a subpixel row group, and the first signal line structure is configured to be connected to the (n)th row and (n+1)th row of subpixels; and
    n is an odd number or an even number greater than zero, the array substrate further comprises a plurality of first power lines extending in the first direction and configured to provide a first power signal to the plurality of subpixels,
    wherein each first signal line structure of the plurality of first signal line structures is provided with two first power lines respectively on opposite sides of the each first signal line structure.

2. The array substrate according to claim 1, wherein any one of the plurality of first signal line structures is not located between two adjacent subpixel row groups.

3. The array substrate according to claim 1, wherein at least two of the subpixels in two adjacent rows are symmetrical with respect to the first signal portion.

4. The array substrate according to claim 1, further comprising a plurality of second power lines, wherein the plurality of second power lines extend along the second direction, and the plurality of second power lines cross the plurality of first power lines and are electrically connected to the plurality of first power lines.

5. The array substrate according to claim 4, wherein each first signal portion is provided with two second power lines respectively on opposite sides of the each first signal portion.

6. The array substrate according to claim 1, wherein a plurality of first signal portions are sequentially arranged along the first direction and are insulated from each other, and the first signal portions of the plurality of first signal line structures form a signal portion array that is arranged in a plurality of rows and a plurality of columns along the first direction and the second direction; and
    each of the plurality of first signal portions is correspondingly connected to at least two of the subpixels located in a same row.

7. The array substrate according to claim 6, further comprising a plurality of second signal portions, wherein the plurality of second signal portions extend along the second direction, and the plurality of first signal portions located in a same column are electrically connected to each other through a second signal portion corresponding to the plurality of first signal portions located in the same column.

8. The array substrate according to claim 7, wherein every m subpixels located in a same row form a pixel unit, each of the plurality of first signal portions is correspondingly connected to at least two of the pixel units in the same row, and m=2, 3, or 4.

9. The array substrate according to claim 7, wherein an orthographic projection of the first signal portion is substantially surrounded by an orthographic projection of the second signal portion and the first power lines.

10. The array substrate according to claim 1, wherein the subpixel further comprises a first capacitor, a distance between the first signal portion and the first capacitor is larger than a distance between the first power lines and the first capacitor.

11. The array substrate according to claim 1, wherein, in the second direction, the plurality of first signal line structures and the plurality of first power lines are alternatively arranged one by one.

12. The array substrate according to claim 1, wherein the at least one subpixel further comprises a second transistor;
- a first electrode of the first transistor is configured to receive the first power signal, and a second electrode of the first transistor is connected to a first electrode of the second transistor and a first electrode of the light-emitting element; and
- a gate electrode of the second transistor is configured to receive a scanning signal, and a second electrode of the second transistor is electrically connected to one first signal portion.

* * * * *